United States Patent
Chen et al.

(10) Patent No.: US 11,947,248 B2
(45) Date of Patent: Apr. 2, 2024

(54) VIDEO CAMERA HANDLE AND STOP SWITCH ASSEMBLY

(71) Applicant: SHENZHEN LEQI NETWORK TECHNOLOGY CO., LTD., Shenzhen (CN)

(72) Inventors: Paihan Chen, Shenzhen (CN); Xingxing Yuan, Shenzhen (CN)

(73) Assignee: SHENZHEN LEQI NETWORK TECHNOLOGY CO., LTD., Shenzhen (CN)

( * ) Notice: Subject to any disclaimer, the term of this patent is extended or adjusted under 35 U.S.C. 154(b) by 218 days.

(21) Appl. No.: 17/693,455

(22) Filed: Mar. 14, 2022

(65) Prior Publication Data
US 2022/0214605 A1 Jul. 7, 2022

Related U.S. Application Data
(63) Continuation of application No. PCT/CN2020/082138, filed on Mar. 30, 2020.

(30) Foreign Application Priority Data
Sep. 30, 2019 (CN) .......................... 201910943948.3

(51) Int. Cl.
G03B 17/56 (2021.01)
F16C 11/04 (2006.01)
F16M 13/04 (2006.01)
H05K 5/02 (2006.01)

(52) U.S. Cl.
CPC ............ *G03B 17/563* (2013.01); *F16C 11/04* (2013.01); *F16M 13/04* (2013.01); *H05K 5/026* (2013.01)

(58) Field of Classification Search
None
See application file for complete search history.

(56) References Cited

U.S. PATENT DOCUMENTS
D923,450 S * 6/2021 Chen .............................. D8/308

FOREIGN PATENT DOCUMENTS

| CN | 201651683 U | 11/2010 | |
|---|---|---|---|
| CN | 208421492 U | 1/2019 | |
| CN | 110630882 A | 12/2019 | |
| WO | 2011123930 A1 | 10/2011 | |
| WO | WO-2022047882 A1 * | 3/2022 | ........... F16M 11/121 |
| WO | WO-2023160565 A1 * | 8/2023 | |

* cited by examiner

*Primary Examiner* — Rodney E Fuller

(57) ABSTRACT

A stop switch assembly includes a movable block, a pressing portion, a driving rod, a driving pin and an elastic member. The movable block includes a first pair and a second pair of opposite side surfaces, a hole is defined in the movable block passing through the first pair of side surfaces and an inclined slot is defined in the movable block passing through the second pair of side surfaces. The driving pin is inserted in the driving rod with its head movably arranged in the inclined slot. The elastic member is arranged between the pressing portion and the movable block for applying an elastic bias to the pressing portion to allow the pressing portion being away from the movable block. When the pressing part is pressed, the driving pin slides in the inclined slot and drives the movable block moving between a first position and a second position.

18 Claims, 3 Drawing Sheets

VIDEO CAMERA HANDLE AND STOP SWITCH ASSEMBLY

TECHNICAL FIELD

The present disclosure relates to the field of photographic equipment, and more particularly to a video camera handle and its stop switch assembly.

BACKGROUND

Video camera bracket in the prior art is commonly provided with a handle which provides the cameraman convenience for carrying. The handle is usually mounted with an external device, a card slot for cooperating with the external device is arranged in a top surface of the handle, and a movable stopper is arranged in the card slot. When the external device is installed in the card slot, the stopper protrudes from the card slot, which can prevent the external device from slipping out of the card slot. Before the external device being installed in the card slot, and at the time the external device being detached from the card slot, the stopper needs to be hidden into the card slot. In an existing stopper, an operating rod fixed with the stopper is protruded from a side of the handle, the stopper can be driven to move down and hide into the card slot by pressing the operating rod downward. Once the operating rod is released, the stopper will protrude from the card slot under an elastic force of a spring. Such an operation is laborious, which brings inconvenience to the users when using the stopper.

SUMMARY

The present disclosure provides a video camera handle which is easy to be operated.

The present disclosure also provides a stop switch assembly used for the video camera handle.

The present disclosure provides a stop switch assembly. The stop switch assembly includes a movable block, a pressing portion, a driving rod, a driving pin, and an elastic member. The movable block comprises a first pair of opposite side surfaces and a second pair of opposite side surfaces, a hole is defined in the movable block which passes through the first pair of opposite side surfaces, and an inclined slot is defined in the movable block which passes through the second pair of opposite side surfaces. The pressing portion is movably arranged at one end of the hole and the driving rod is movably arranged at the other end of the hole, and the pressing portion and the driving rod are connected by driving. The driving pin is inserted in the driving rod, and a head of the driving pin is movably arranged in the inclined slot. The elastic member is arranged between the pressing portion and the movable block or between the driving rod and the movable block, for applying an elastic bias to the pressing portion or the driving rod to allow the pressing portion being away from the movable block. When the pressing part is pressed, the driving pin slides in the inclined slot and drives the movable block to move between a first position and a second position.

In some embodiments, a lower end of the inclined slot is arranged at a side of the movable block closing to the pressing portion, an upper end of the inclined slot is arranged at a side of the movable block closing to the driving rod, the upper end of the inclined slot is higher than the lower end of the inclined slot in a height direction of the movable block, and the height direction of the movable block is perpendicular to a pressing direction of the pressing portion.

In some embodiments, the card slot may be a cold shoe interface.

In some embodiments, the driving pin drives the movable block to move between the first position and the second position by pushing a bottom surface or an upper surface of the inclined slot, the driving pin is located at the lower end of the inclined slot when the movable block is at the first position, and the drive pin is located at the upper end of the inclined slot when the movable block is at the second position.

In some embodiments, the stop switch assembly further comprises a connecting member having a first connecting end detached connected with the pressing portion and a second connecting end detached connected with the driving rod.

In some embodiments, a connecting groove is defined in a side of the pressing portion facing the driving rod, the elastic member is sleeved on the connecting member with one end of the elastic member accommodated in the connecting groove and abutted against the bottom wall of the connecting groove and the other end of the elastic member abutted against a side wall of which defines the hole of the movable block towards the pressing portion, a first connecting hole is defined which passes through the bottom wall of the connecting groove, and the first connecting end is threaded connected in the first connecting hole.

In some embodiments, one end of the driving rod facing the pressing portion is defined with a second connection hole, the second connecting end is threaded connected in the second connecting hole, a pin hole is defined in a side of the driving rod closing to the second connecting hole, the pin is inserted in the pin hole, and the pin hole communicates with the second connecting hole.

In some embodiments, the size of the hole is larger than the size of the driving rod in a height direction of the movable block to allow the movable block to move relative to the driving rod in the height direction.

The present disclosure also provides a video camera handle including a handle portion and a mounting portion connected with the handle portion. The mounting portion is configured to mount the video camera handle to a video camera, and a card slot is defined at a joint of the handle portion and the mounting portion for connecting an external video device. A receiving groove is defined at the joint of the handle portion and the mounting portion to communicate with the card slot, and the stop switch assembly described above is received in the receiving groove.

In some embodiments, the mounting portion is connected to one end of the handle portion.

In some embodiments, the card slot is defined in a top surface of the handle portion adjacent to the mounting portion, a through hole is defined in the card slot to communicate with the card slot and the receiving groove, and the movable block is movably arranged in the receiving groove. When the movable block is located at the first position, the top of the movable block protrudes from the through hole to prevent the external video device from escaping from the card slot, and when the movable block is located at the second position, the top of the movable block hides in the through hole or the receiving groove to allow the external video device assembling in or disassembling from the card slot.

In some embodiments, the card slot is "U" shaped and comprises an open end, and the through hole is defined at the open end of the "U" shape card slot.

In some embodiments, the mounting portion comprises opposite first end surface and second end surface, the first end surface is defined with a first groove, the second end surface is defined with a second groove, the bottom wall of the first groove is defined with a first through hole, and the bottom wall of the second groove is defined with a second through hole, the pressing portion is movably arranged in the first groove, the driving rod passes through the second through hole and is movably arranged in the second groove, and the connecting member passes through the first through hole to connect with the driving rod.

In some embodiments, one end of the driving rod away from the pressing portion is provided with an enlarged stop portion, when the movable block is at the first position, the pressing portion is away from the first groove to allow the head of the pressing portion protrudes out of the first groove to be pressed, and the stop portion abuts on the wall of the second groove; when the movable block is located at the second position, an end of the pressing portion facing the driving rod locates closing to the bottom wall of the first groove or abuts against the bottom wall of the first groove, and the stop portion of the driving rod is away from the second groove.

In some embodiments, a plurality of connecting hole are defined in a top surface of the handle portion for connecting external devices.

In some embodiments, a bottom surface of the handle portion is arranged with wavy or screw thread concave-convex structures for facilitating the hold by users.

In some embodiments, the mounting portion comprises a connecting end configured for connecting with the handle portion, an extending section extending downward from the connecting end and away from the handle portion, a bending section bent inward from the end of the extending section, and a distal end connected to the end of the bending section and facing to the handle portion. The connecting end is obliquely defined relative to the handle, the distal end is provided with a connecting structure for connecting the video camera handle to a bracket of a video camera, and the extending section is defined with a connecting hole for connecting external devices.

In some embodiments, the end of the handle portion away from the mounting portion is further defined with another card slot for connecting an external device.

To sum up, the stop switch assembly provided by the present disclosure includes the movable block, the pressing portion, the driving rod, the driving pin, the connecting member, and the elastic member. The movable block is movably arranged in the receiving groove, the movable block is defined with a hole and an inclined slot, and the pressing portion and the driving rod are respectively arranged at one of the both ends of the hole and are connected by the connecting member. The driving pin is inserted in the driving rod with its head located in the inclined slot, and the elastic member abuts between the pressing portion and the movable block. In a normal state, the movable block is located at the first position, the top of the movable block protrudes from the card slot of the handle so as to achieve a stop effect. When the pressing portion is pressed, the driving rod is driven by the pressing portion through the connecting member to move along the pressing direction, allowing the driving pin pushing the wall of the inclined slot during a moving of the driving pin along with the driving rod, making the movable block move to the second position where the movable block can hide in the card slot. The stop switch assembly of the present disclosure is an ingenious design, has stronger practicability, can be disassembled and assembled, and is particularly convenient to be operated. The stop switch assembly can be switched by just pressing the pressing portion, which is extremely labor-saving, so that brings great convenience to users when using the stop switch assembly.

DETAILED DESCRIPTION

The embodiment of the present disclosure will be clearly and completely described in the following with reference to the accompanying drawings. It is to be understood that the disclosure is not limited to the detailed structures described herein below or in the accompanying drawings. Also, it is to be understood that the phraseology and terminology used herein is for the purpose of description and should not be interpreted as limiting. As used herein, "include", "contain", "have" and similar expressions are meant to encompass the items listed thereafter, their equivalents, and other additional items. In particular, when describing "a certain member", the present disclosure does not limit the number of the member to one, and "a certain member" may also include a plurality of members.

Figure 1:
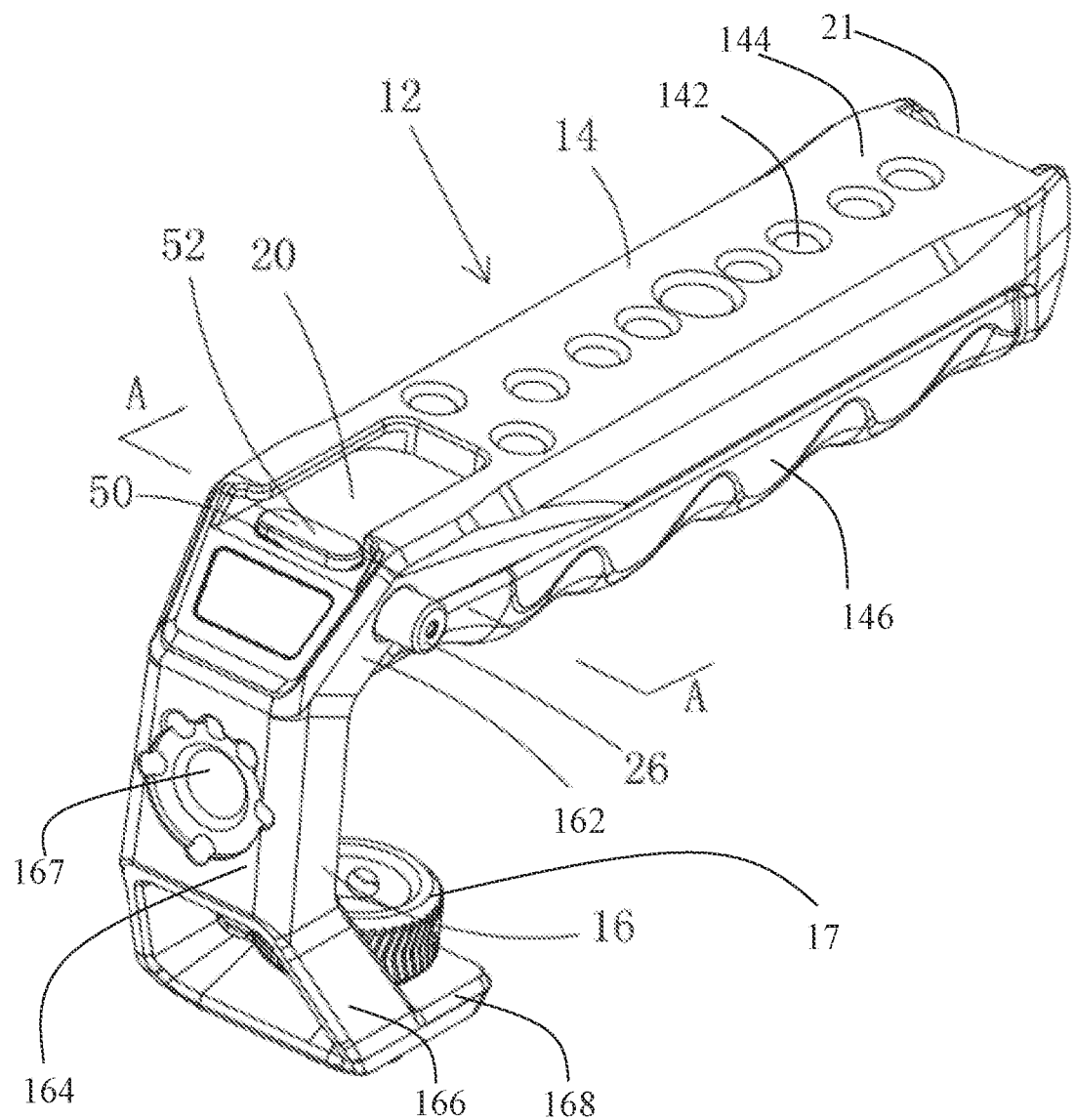
FIG. 1 is a perspective view of a video camera handle according to an exemplary embodiment of the present disclosure.
Figure 3:
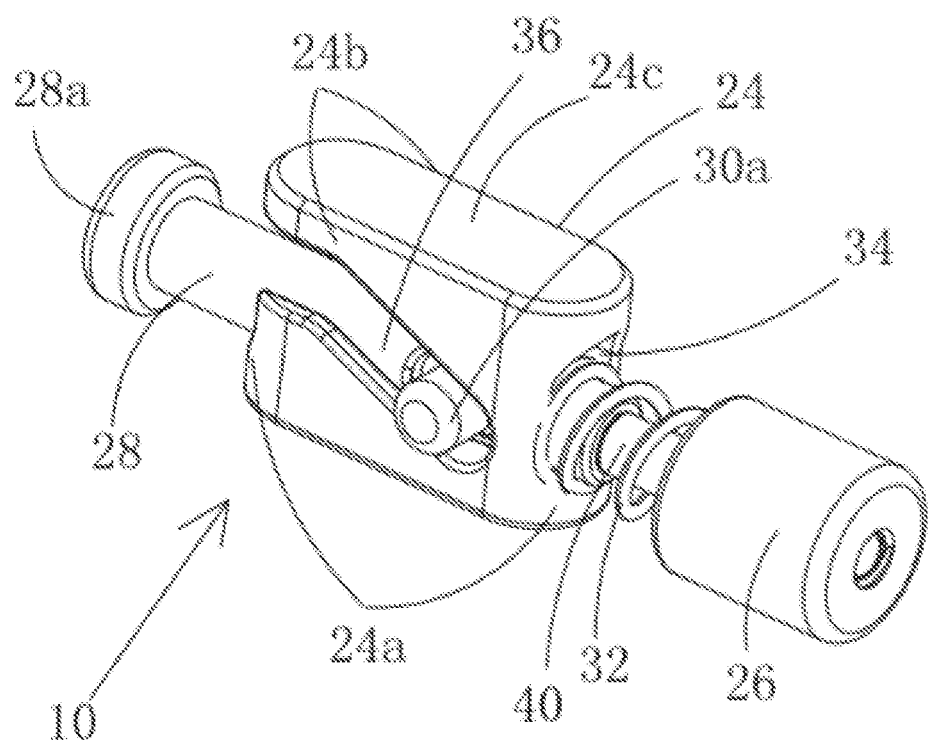
FIG. 3 is a perspective view of a stop switch assembly according to an exemplary embodiment of the present disclosure.
Figure 4:
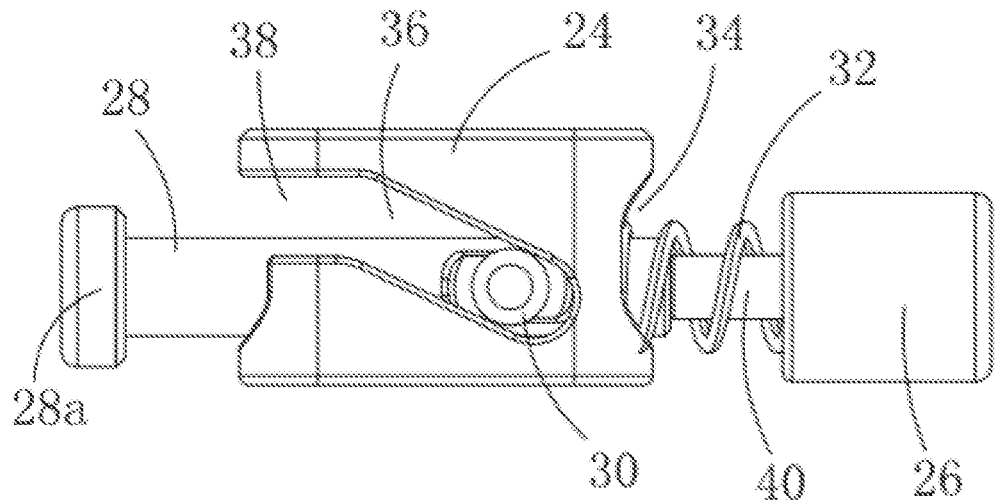
FIG. 4 is a side view of a stop switch assembly according to an exemplary embodiment of the present disclosure.

Please referring to FIG. 1 and FIG. 3, the present disclosure provides an stop switch assembly 10 which can be applied to a video camera handle 12. In some other embodiments, the stop switch assembly 10 can also be applied to other photographic accessories or mechanical parts, such as a camera frame. The video camera handle 12 includes a handle portion 14 and a mounting portion 16 connected to the bottom or one end of the handle portion 14. In an exemplary embodiment, the mounting portion 16 is connected to one end of the handle portion 14. In some instances, the mounting portion 16 can also be connected to the bottom of the handle portion 14. The mounting portion 16 is configured to mount the video camera handle 12 on a video camera through a connecting structure. For example, the video camera handle 12 can be mounted to the video camera by fixing the bottom of the mounting portion 16 on a bracket of the video camera though a connecting screw 17. The handle portion 14 is configured to be carried by users so as to change shooting angles of video cameras by lifting the handle portion 14. The mounting portion 16 includes a connecting end 162 for connecting with the handle portion 14, an extending section 164 extending downward from the connecting end 162, a bending section 166 bent inward from the end of the extending section 164, and a distal end 168 connected to the end of the bending section 166 and facing to the handle portion 14. In an exemplary embodiment, the connecting end 162 is obliquely connected with the handle portion 14, and a bending angle is formed between the handle portion 14 and the mounting portion 16. The handle portion 14 and the mounting portion 16 as a whole form a substantially L-shaped structure, with the distal end 168 being parallel and facing to the handle portion 14. The connecting screw 17 may be arranged on the distal end 168, and the extending section 164 may be defined with a connecting hole, such as, an Alecon 167, for connecting external devices. The handle portion 14 and the mounting portion 16 can be integrally formed, or can be separate parts and be assembled together. In an exemplary embodiment, the handle portion 14 and the mounting portion 16 are integrally formed.

Figure 2:
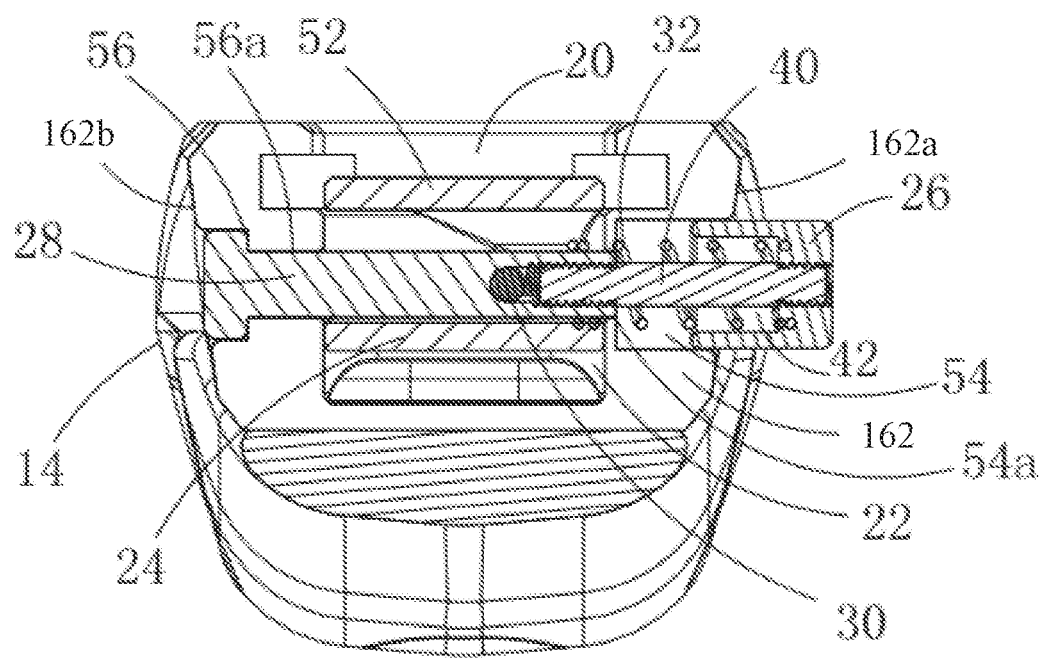
FIG. 2 is a cross sectional view of FIG. 1 taken along line A-A according to an exemplary embodiment of the present disclosure.

A card slot 20 is defined in a top surface of the handle portion 14 closing to the connecting end 162. The card slot 20 is configured for connecting an external device. For example, the external device may be latched in the card slot 20. An end of the handle portion 14 away from the mounting portion 16 is defined with another card slot 21 which is configured for connecting other external devices. The card slot 20 or 21 may be a cold shoe interface. Referring to FIG. 2, the connecting end 162 is defined with an receiving groove 22 at a position corresponding to the card slot 20, and the stop switch assembly 10 is movably installed in the receiving groove 22. It should be understood that no matter how the mounting portion 16 is connected to the handle portion 14, the card slot 20 should be arranged corresponding to the arranging of the stop switch assembly 10 to achieve a mutual cooperation between the two. A top surface of the handle portion 14 is defined with a plurality of connecting holes 142, such as threaded holes, for connecting external devices. The size of the connecting holes can be set according to the needs of use. For example, the diameter of the adjacent connecting holes can be the same or different. A bottom surface of the handle portion 14 is wavily arranged for users to hold. In an exemplary embodiment, the handle portion 14 includes two parts, with a main body 144 as a first part and a grip part 146 connected with the main body 144 as a second part. The main body 144 can be made of metal material and fixedly connected with the mounting portion 16 or integrally formed with the mounting portion 16. The grip part 146 can be made of wood or other non-metal materials, and a side of the grip part 146 away from the main body 144 is arranged with wavy or screw thread concave-convex structures to facilitate the holding by users.

Please referring to FIG. 2 to FIG. 5, the stop switch assembly 10 includes a movable block 24, a pressing portion 26, a driving rod 28, a driving pin 30, and an elastic member 32. The movable block 24 is movably arranged in the receiving groove 22, that is, the movable block 24 can move up and down in the receiving groove 22. In an exemplary embodiment, the movable block 24 is substantially a cuboid structure having a first pair of opposite side surfaces 24a along a length direction of the movable block 24, a second pair of opposite side surfaces 24b along a width direction of the movable block 24, and a third pair of opposite top surface 24c and bottom surface. The side surfaces 24a are arc-shaped surfaces which protrude outward, and the side surfaces 24b are flat surfaces. In some other embodiments, the movable block 24 may have a different shape, and the shape of the movable block 24 is not limited here.

The pressing portion 26 and the driving rod 28 are movably installed in the movable block 24. A hole 34 is defined in the movable block 24 which passes through the first pair of opposite side surfaces 24a, and an inclined slot 36 is defined in the the movable block 24 which passes through the second pair of opposite side surfaces 24b. In an exemplary embodiment, an inclining direction of the inclined slot 36 is along with the length direction of the movable block 24, and the hole 34 communicates with the inclined slot 36. The pressing portion 26 is movably arranged at one end of the hole 34, and the driving rod 28 is movably arranged at the other end of the hole 34. A driving pin 30 is inserted in the driving rod 28, and a head 30a of the driving pin 30 can move in the inclined slot 36. An elastic member 32, such as a spring 32, is elastically abutted between the pressing portion 26 and the movable block 24, so as can apply an elastic bias to the pressing portion 26 to keep the pressing portion 26 away from the movable block 24, so that when the pressing portion 26 is pressed, the driving pin 30 may slide in the inclined slot 36 to drive the movable block 24 to move between a first position and a second position. In a height direction of the movable block 24, the size of the hole 34 is larger than the size of the driving rod 28 so that the movable block 24 can move relative to the driving rod 28 in the height direction of the movable block 24.

In an exemplary embodiment, the inclined slot 36 is a straight slot, and has an inclining direction extending from the top surface 24c of the movable block 24 toward the bottom surface. An upper end of the inclined slot 36 is arranged at a side of the movable block 24 closing to the driving rod 28, and a lower end of the inclined slot 36 is arranged at a side of the movable block 24 closing to the pressing portion 26. When the movable block 24 is located at the first position, the driving pin 30 is located at the lower end of the inclined slot 36, and when the movable block 24 is located at the second position, the driving pin 30 is located at or near the upper end of the inclined slot 36. In case the pressing portion 26 is pressed, the pressing portion 26 moves towards the movable block 24 and drive the driving rod 28 to move along an axial direction of the driving rod 28 or the pressing portion 26, and simultaneously the driving pin 30 moves along with the driving rod 28. In an exemplary embodiment, the axial direction is also the extending direction of the receiving groove 22, and also the width direction of the handle portion 14. At this time, the bottom wall of the inclined slot 36 acts as a driving surface that interacts with the head 30a of the driving pin 30 where the head 30a pushes the driving surface during its moving along with the driving pin 30, so as to drive the movable block 24 moving from the first position to the second position, namely, to drive the movable block 24 moving downward. The spring 32 is squeezed by the pressing portion 26 during the movement of the pressing portion 26, and will automatically return to its initial position under an elastic bias of the spring 32 when the pressing to the pressing portion 26 is released at the time the movable block 24 arrives at the second position. After the pressing portion 26 is released, the pressing portion 26 also returns to its initial position, and the driving pin 30 is driven to return from the upper end of the inclined slot 36 to the lower end of the inclined slot 36, during which the driving pin 30 pushes the top wall of the inclined slot 36 so as to drive the movable block 24 moving upward to return the first position from the second position.

In an exemplary embodiment, the upper end of the inclined slot 36 extends to define an open 38 passing through one of the first pair of side surfaces 24a closing to the driving rod 28.

In the embodiments described above, the inclined slot 36 is a straight slot, and inclines a predetermined angle relative to the pressing direction of the pressing portion 26. In some other embodiments, the inclined slot 36 can also be set as other shapes, such as arc-shaped, as long as it can cooperate with the driving pin 30 to drive the movable block 24 moving between the first position and the second position during the driving pin 30 moves along with the pressing portion 26. The shape of the inclined slot 36 is not limited here.

The pressing portion 26 is connected with the driving rod 28. Specifically, the stop switch assembly 10 further includes a connecting member 40, and the connecting member 40 has opposite first connecting end 40a and second connecting end 40b. The first connecting end 40a is detachably connected to the pressing portion 26, such as by threaded connection, and the second connecting end 40b is detachably connected to the driving rod 28, such as by threaded connection.

Figure 5:
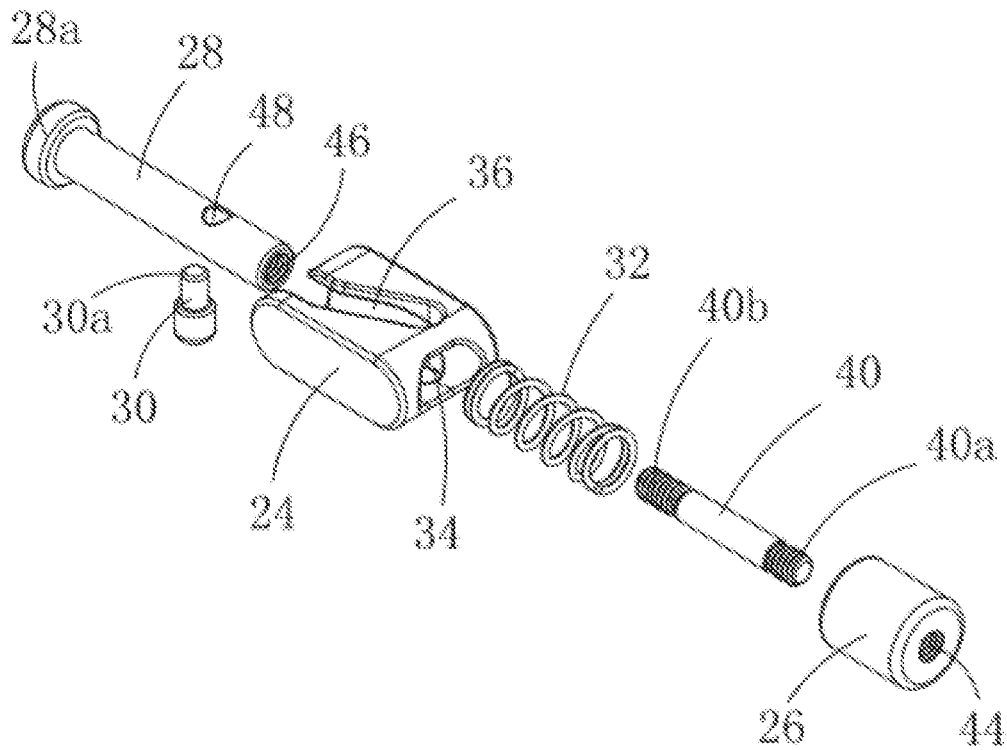
FIG. 5 is an exploded view of a stop switch assembly according to an exemplary embodiment of the present disclosure.

Please referring to FIG. 2 and FIG. 5, a connecting groove 42 is defined in a side of the pressing portion 26 facing the driving rod 28, a first connecting hole 44 is defined in the pressing portion 26 which passes through the groove wall of the connecting groove 42 and the other side of the pressing portion 26, and an inner wall of the first connecting hole 44 is provided with internal threads. One end of the driving rod 28 facing the pressing portion 26 is defined with a second connection hole 46, and an inner wall of the second connection hole 46 is provided with internal threads. Correspondingly, the first connecting end 40a and the second connecting end 40b of the connecting member 40 are provided with external threads. The first connecting end 40a is threaded connected in the first connection hole 44, and the second connecting end 40b is threaded connected in the second connecting hole 46. The spring 32 is sleeved on the connecting member 40, one end of the spring 32 facing the pressing portion 26 is accommodated in the connecting groove 42 and abuts against the groove wall of the connecting groove 42, and the other end of the spring 32 abuts against the side wall of which defines the hole 34 of the movable block 24. During a movement of the movable block 24 between the first position and the second position, a side wall of the receiving groove 22 will give a restriction to the movable block 24 to avoid a movement of the movable block 24 towards the pressing direction of the pressing portion 26, therefore, when the pressing portion 26 is pressed, the spring 32 will not move along with the pressing direction of the pressing portion 26 and is compressed when the pressing portion 26 is pressed.

The driving pin 30 is inserted in the driving rod 28. In some instances, a pin hole 48 is defined in the driving rod 28 at a location closing to the second connecting hole 46, and the driving pin 30 is inserted in the pin hole 48 with the head 30a of the driving pin 30 protruding out of the pin hole 48 and received in the inclined slot 36. In an exemplary embodiment, the pin hole 48 communicates with the second connecting hole 46, so that the second connecting end 40b of the connecting member 40 can abut against the driving pin 30. It should be understood that, since the inclined slot 36 passes through the second pair of opposite side surfaces 24b of the movable block 24, both the head and tail of the driving pin 30 can be exposed from the pin hole 48 to respectively push the wall of the inclined slot 36 during a movement of the movable block 24 between the first position and the second position. Of course, it is also workable for either the head or the tail of the driving pin 30 exposing from the pin hole 48 to match with the wall of the inclined slot 36, and in such case, the inclined slot 36 can only pass through one of the two side surfaces 24b.

It should be understood that the above-mentioned threaded connection between the pressing portion 26 and the driving rod 28 by the connecting member 40 is illustrative, which is not limited here. In some other embodiments, the pressing portion 26 and the driving rod 28 can have other connecting relationship. For example, the first connecting end 40a of the connecting member 40 can be fixedly connected with the pressing portion 26, such as by welding, gluing, or clasping; or the second connecting end 40b of the connecting member 40 can be fixedly connected with the driving rod 28.

Please referring to FIG. 1 and FIG. 2, a through hole 50 is defined at a location corresponding to the movable block 24 to communicate the card slot 20 and the receiving groove 22, and a top 52 of the movable block 24 is movably arranged in the through hole 50. When the movable block 24 is located at the first position, the top 52 of the movable block 24 protrudes out of the through hole 50 to form a stopper for the card slot 20, which can prevent the camera installed in the card slot 20 from detaching from the card slot 20; when the movable block 24 is located at the second position, the top 52 of the movable block 24 is hidden into the through hole 50 and is accommodated in the receiving groove 22, at this time, the camera can be installed into the card slot 20 or be detached from the card slot 20. In an exemplary embodiment, the card slot 20 is U-shaped and includes an open end, and the through hole 50 is defined at the open end.

In some instances, the connecting end 162 of the mounting portion 16 has opposite first end surface 162a and second end surface 162b, the pressing portion 26 is located at the side of the first end surface 162a, and the driving rod 28 is located at the side of the second end surface 162b. The first end surface 162a is defined with a first groove 54, the second end surface 162b is defined with a second groove 56, the bottom wall of the first groove 54 is defined with a first through hole 54a, and the bottom wall of the second groove 56 is defined with a second through hole 56a. The pressing portion 26 is movably arranged in the first groove 54, the connecting member 40 passes through the first through hole 54a, and the driving rod 28 passes through the second through hole 56a and is movably arranged in the second groove 56. One end of the driving rod 28 away from the pressing portion 26 is provided with an enlarged stop portion 28a, when the movable block 24 is at the first position, the pressing portion 26 is away from the first groove 54 so that its head protrudes out of the first groove 54 for users to press, and the stop portion 28a abuts on the wall of the second groove 56 to prevent the pressing portion 26 from escaping from the first groove 54. At this time, the driving rod 28 abuts against the bottom wall of the hole 34 of the movable block 24, to provide a limitation to the movable block 24 in a vertical direction to prevent the movable block 24 from escaping from the receiving groove 22. When the movable block 24 is at the second position, the end of the pressing portion 26 facing the driving rod 28 abuts against the bottom wall of the first groove 54, the stop portion 28a of the driving rod 28 is away from the second groove 56, and the bottom of the movable block 24 abuts on the bottom of the receiving groove 22. In some other embodiments, when the movable block 24 is at the second position, the end of the pressing portion 26 facing the driving rod 28 may be located close to the bottom wall of the first groove 54, and the bottom of the movable block 24 may be located close to the bottom of the receiving groove 22.

The above-mentioned orientation expression such as "upper", "lower", and "vertical" are referred to the placement positions shown in the Figures which is for the convenience of description. It is understood that when the placement positions are changed, the orientation expression can be adjusted accordingly.

The stop switch assembly provided by the present disclosure includes the movable block, the pressing portion, the driving rod, the driving pin, the connecting member, and the elastic member. The movable block is movably arranged in the receiving groove, the movable block is defined with a hole and an inclined slot, and the pressing portion and the driving rod are respectively arranged at one of the both ends of the hole and are connected by the connecting member. The driving pin is inserted in the driving rod with its head located in the inclined slot, and the elastic member abuts between the pressing portion and the movable block. In a normal state, the movable block is located at the first position, the top of the movable block protrudes from the card slot of the handle so as to achieve a stop effect. When the pressing portion is pressed, the driving rod is driven by the pressing portion through the connecting member to move along the pressing direction, allowing the driving pin pushing the wall of the inclined slot during a moving of the driving pin along with the driving rod, making the movable block move to the second position where the movable block can hide in the card slot. The stop switch assembly of the present disclosure is an ingenious design, has stronger practicability, can be disassembled and assembled, and is particularly convenient to be operated. The stop switch assembly can be switched by just pressing the pressing portion, which is extremely labor-saving, so that brings great convenience to users when using the stop switch assembly.

It is to be understood, however, that the concepts described herein may be embodied in other forms without departing from the spirit and characteristics thereof. The embodiments disclosed are to be regarded as illustrative and not restrictive. Accordingly, the scope of the disclosure is to be determined by the appended claims, rather than by the foregoing description. Any changes that come within the literal meaning and equivalency of the claims should fall within the scope of the claims.

What is claimed is:

1. A stop switch assembly, comprising:
    a movable block, a pressing portion, a driving rod, a driving pin, and an elastic member,
    the movable block comprising a first pair of opposite side surfaces and a second pair of opposite side surfaces, a hole being defined in the movable block which passes through the first pair of opposite side surfaces, and an inclined slot being defined in the movable block which passes through the second pair of opposite side surfaces; the pressing portion being movably arranged at one end of the hole and the driving rod being movably arranged at the other end of the hole, and the pressing portion and the driving rod being connected by driving; the driving pin being inserted in the driving rod, and a head of the driving pin being movably arranged in the inclined slot; the elastic member being arranged between the pressing portion and the movable block or between the driving rod and the movable block, for applying an elastic bias to the pressing portion or the driving rod to allow the pressing portion being away from the movable block, and when the pressing part is pressed, the driving pin slides in the inclined slot and drives the movable block to move between a first position and a second position.

2. The stop switch assembly according to claim 1, wherein a lower end of the inclined slot is arranged at a side of the movable block closing to the pressing portion, an upper end of the inclined slot is arranged at a side of the movable block closing to the driving rod, the upper end of the inclined slot is higher than the lower end of the inclined slot in a height direction of the movable block, and the height direction of the movable block is perpendicular to a pressing direction of the pressing portion.

3. The stop switch assembly according to claim 2, wherein the driving pin drives the movable block to move between the first position and the second position by pushing a bottom surface or an upper surface of the inclined slot, the driving pin is located at the lower end of the inclined slot when the movable block is at the first position, and the drive pin is located at the upper end of the inclined slot when the movable block is at the second position.

4. The stop switch assembly according to claim 2, wherein the size of the hole is larger than the size of the driving rod in a height direction of the movable block to allow the movable block to move relative to the driving rod in the height direction.

5. The stop switch assembly according to claim 1, wherein the stop switch assembly further comprises a connecting member having a first connecting end detached connected with the pressing portion and a second connecting end detached connected with the driving rod.

6. The stop switch assembly according to claim 5, wherein a connecting groove is defined in a side of the pressing portion facing the driving rod, the elastic member is sleeved on the connecting member with one end of the elastic member accommodated in the connecting groove and abutted against the bottom wall of the connecting groove and the other end of the elastic member abutted against a side wall of which defines the hole of the movable block towards the pressing portion, a first connecting hole is defined which passes through the bottom wall of the connecting groove, and the first connecting end is threaded connected in the first connecting hole.

7. The stop switch assembly according to claim 5, wherein one end of the driving rod facing the pressing portion is defined with a second connection hole, the second connecting end is threaded connected in the second connecting hole, a pin hole is defined in a side of the driving rod closing to the second connecting hole, the pin is inserted in the pin hole, and the pin hole communicates with the second connecting hole.

8. A video camera handle, comprising a handle portion and a mounting portion connected with the handle portion, the mounting portion being configured to mount the video camera handle to a video camera, and a card slot being defined at a joint of the handle portion and the mounting portion for connecting an external video device, wherein a receiving groove is defined at the joint of the handle portion and the mounting portion to communicate with the card slot, and a stop switch assembly is received in the receiving groove;
    wherein the stop switch assembly comprises a movable block, a pressing portion, a driving rod, a driving pin, and an elastic member, the movable block comprises a first pair of opposite side surfaces and a second pair of opposite side surfaces, a hole is defined in the movable block which passes through the first pair of opposite side surfaces, and an inclined slot is defined in the movable block which passes through the second pair of opposite side surfaces; the pressing portion is movably arranged at one end of the hole and the driving rod is movably arranged at the other end of the hole, and the pressing portion and the driving rod are connected by driving; the driving pin is inserted in the driving rod, and a head of the driving pin is movably arranged in the inclined slot; the elastic member is arranged between the pressing portion and the movable block or between the driving rod and the movable block, for applying an elastic bias to the pressing portion or the driving rod to allow the pressing portion being away from the movable block, and when the pressing part is pressed, the driving pin slides in the inclined slot and drives the movable block to move between a first position and a second position.

9. The video camera handle according to claim 8, wherein the mounting portion is connected to one end of the handle portion.

10. The video camera handle according to claim 9, wherein the card slot is defined in a top surface of the handle portion adjacent to the mounting portion, a through hole is defined in the card slot to communicate with the card slot and the receiving groove, the movable block is movably arranged in the receiving groove, when the movable block is located at the first position, the top of the movable block protrudes from the through hole to prevent the external video device from escaping from the card slot, and when the movable block is located at the second position, the top of the movable block hides in the through hole or the receiving groove to allow the external video device assembling in or disassembling from the card slot.

11. The video camera handle according to claim 10, wherein the card slot is "U" shaped and comprises an open end, and the through hole is defined at the open end of the "U" shape card slot.

12. The video camera handle according to claim 11, wherein a plurality of connecting hole are defined in a top surface of the handle portion for connecting external devices.

13. The video camera handle according to claim 11, wherein a bottom surface of the handle portion is arranged with wavy or screw thread concave-convex structures.

14. The video camera handle according to claim 11, wherein the mounting portion comprises a connecting end configured for connecting with the handle portion, an extending section extending downward from the connecting end and away from the handle portion, a bending section bent inward from the end of the extending section, and a distal end connected to the end of the bending section and facing to the handle portion; the connecting end is obliquely defined relative to the handle, the distal end is provided with a connecting structure for connecting the video camera handle to a bracket of a video camera, and the extending section is defined with a connecting hole for connecting an external device.

15. The video camera handle according to claim 8, wherein the mounting portion comprises opposite first end surface and second end surface, the first end surface is defined with a first groove, the second end surface is defined with a second groove, the bottom wall of the first groove is defined with a first through hole, and the bottom wall of the second groove is defined with a second through hole, the pressing portion is movably arranged in the first groove, the driving rod passes through the second through hole and is movably arranged in the second groove, and the connecting member passes through the first through hole to connect with the driving rod.

16. The video camera handle according to claim 15, wherein one end of the driving rod away from the pressing portion is provided with an enlarged stop portion, when the movable block is at the first position, the pressing portion is away from the first groove to allow the head of the pressing portion protrudes out of the first groove to be pressed, and the stop portion abuts on the wall of the second groove; when the movable block is located at the second position, an end of the pressing portion facing the driving rod locates closing to the bottom wall of the first groove or abuts against the bottom wall of the first groove, and the stop portion of the driving rod is away from the second groove.

17. The video camera handle according to claim 8, wherein another card slot is defined in an end of the handle portion away from the mounting portion for connecting external device.

18. The video camera handle according to claim 8, wherein the card slot is a cold shoe interface.

* * * * *